(12) United States Patent
Min et al.

(10) Patent No.: US 6,263,124 B1
(45) Date of Patent: Jul. 17, 2001

(54) PHOTOCONDUCTIVE SWITCH

(75) Inventors: Pan Min, Uppsala; Mark Irwin, Västerås; Erik Johansson, Västerås; Mats Ekberg, Västerås; Anders Sunesson, Åkarp; Hans Bernhoff, Västerås; Jan Isberg, Västerås; Peter Isberg, Västerås; Åke Öberg, Uppsala, all of (SE)

(73) Assignee: ABB AB, Vasteras (SE)

( * ) Notice: Subject to any disclaimer, the term of this patent is extended or adjusted under 35 U.S.C. 154(b) by 0 days.

(21) Appl. No.: 09/304,901

(22) Filed: May 4, 1999

(51) Int. Cl.$^7$ ..................................... G02B 6/35
(52) U.S. Cl. ............. 385/16; 250/214 LS; 313/484
(58) Field of Search ................ 385/14–23, 147; 250/214 LS, 214.1, 214 AL, 214 B, 214 C, 215; 313/483, 484

(56) References Cited

U.S. PATENT DOCUMENTS

| | | | |
|---|---|---|---|
| 3,958,207 | * 5/1976 | Tutihasi | 250/214 LS X |
| 4,119,840 | * 10/1978 | Nelson | 250/214.1 |
| 4,386,283 | 5/1983 | Roggwiller et al. | 307/117 |
| 5,504,391 | 4/1996 | Turner et al. | 313/570 |
| 5,686,789 | 11/1997 | Schoenbach et al. | 313/491 |
| 5,834,784 | 11/1998 | Morgan et al. | 250/436 |

FOREIGN PATENT DOCUMENTS 0 473 439 A2  3/1992 (EP).

OTHER PUBLICATIONS

Dr. Ulrich Kogelschatz et al., "New Excimer UV Sources For Industrial Applications", ABB Review 3/91 UV Sources, pp. 21–28.

El–Habachi, Ahmed, et al., "Emission Of Excimer Radiation From Direct Current, High–Pressure Hollow Cathode Discharges", Appl. Phys. Lett vol. 72 (1), Jan. 5, 1998, pp. 22–24.

Schoenbach, K. H., et al., "Microhollow Cathode Discharges", Appl. Phys. Lett vol. 68 (1), Jan. 1, 1996, pp. 13–15.

* cited by examiner

*Primary Examiner*—John D. Lee
(74) *Attorney, Agent, or Firm*—Connolly Bove Lodge & Hutz

(57) ABSTRACT

A photoconductive switch comprises a first layer (1), two contact layers (2, 3) arranged on said first layer and connectable to different potentials for applying a voltage thereacross, said first layer being adapted to be conducting upon applying a voltage across said contact layers when exposed to light from an illumination source of an energy high enough for lifting charge carriers from the valence band to the conduction band of the material of said first layer. The illumination source is an excimer lamp, in which unstable electronically excited dimers are formed when a voltage is applied across first and second electrodes (12, 13) separated by a gas or gas mixture. The dimers so formed decompose into two gas atoms while emitting a photon of an energy suitable for lifting charge carriers from the valence band to the conduction band of the material of the first layer.

32 Claims, 2 Drawing Sheets

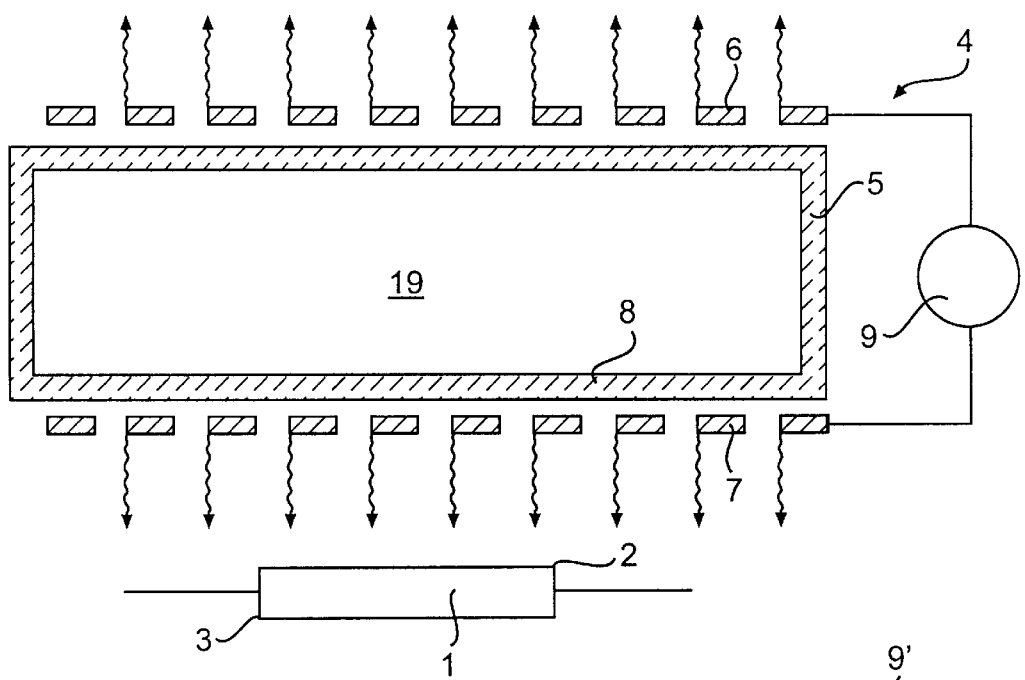
FIG. 1
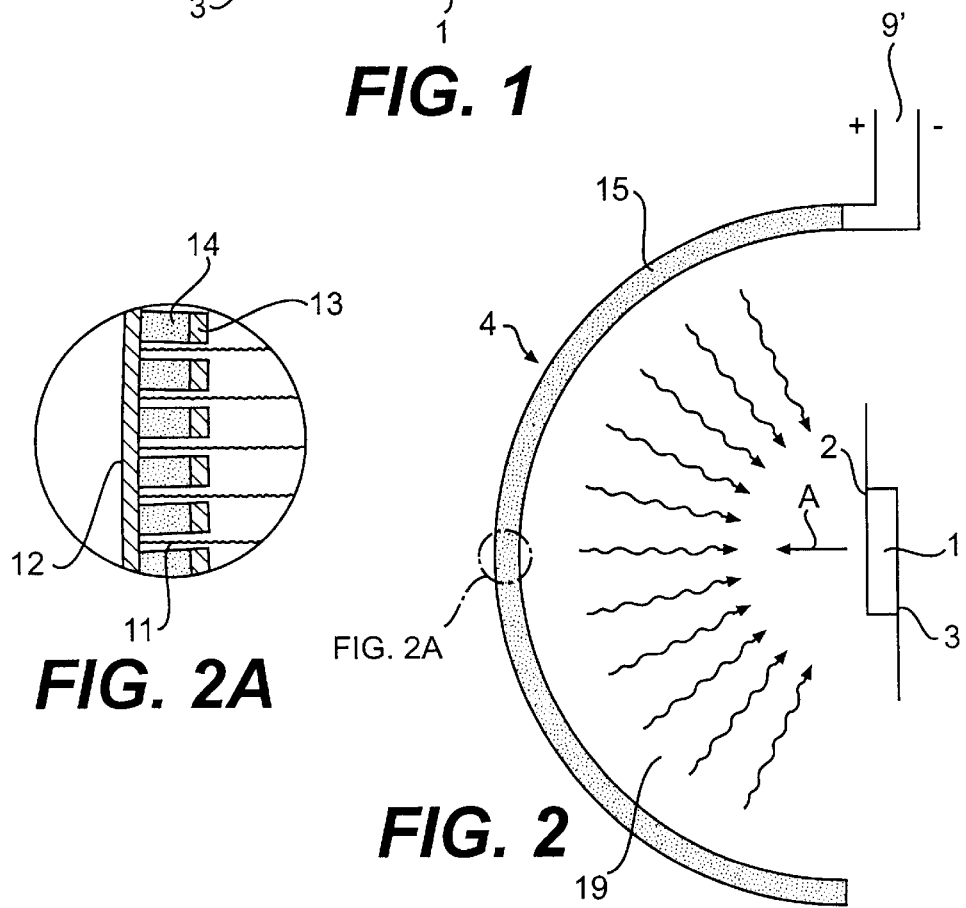
FIG. 2A
FIG. 2

PHOTOCONDUCTIVE SWITCH

TECHNICAL FIELD OF THE INVENTION AND PRIOR ART

The present invention relates to a photoconductive switch comprising at least a first layer and two contact layers arranged on said first layer and connectable to different potentials for applying a voltage thereacross, said first layer being adapted to be conducting upon applying a voltage across said contact layers when exposed to light from an illumination source of an energy high enough for creating charge carriers in the material of said first layer.

A switch of this type finds many applications, and it may for instance be used in equipment for handling high electric power for switching high voltages (which may be 2–400 kV) and currents, for example in surge diverters, current limiters and the like. An advantage of a switch of this type is that illumination control provides for a very fast switching, which is of particular importance in high power applications for protection of the equipment when faults occur.

One problem of such switches already known is that the illumination sources thereof have poor efficiency, i.e. an unproportionally high power input is required for obtaining the degree of illumination necessary for appropriately controlling the switch. The reason for this is that only certain wavelengths of the light produced by such an illumination source may be utilized for creating said charge carriers in the material of said first layer and accordingly close the switch, namely the wavelengths being shorter than a threshold wavelength corresponding to the energy gap between said valence band and conduction band, and the illumination sources used in such switches generate light distributed over a comparatively wide spectrum, so that a large part thereof may not be utilized for the generation of free charge carriers in said layer. Accordingly, much of the power consumed in producing illumination required to trigger the switch such that when conductive, low on-state losses are obtained, is wasted, Activating the switch thusly is not cost-effective.

SUMMARY OF THE INVENTION

The object of the present invention is to provide a photoconductive switch of the type defined in the introduction being in at least some aspect improved with respect to such switches already known and which at least partially solves the problems discussed above of the switches already known.

This object is according to the present invention obtained by providing such a photoconductive switch, in which the illumination source is a device comprising a volume filled with a gas or gas mixture having gas atoms able to form unstable electronically excited dimers when such a voltage is supplied over a gap in said volume that free electrons are created and accelerated to come into collision with said gas atoms for excitation thereof, said dimers decomposing into two gas atoms while emitting a photon of an energy suitable for creating charge carriers in said material of the first layer, the pressure of the gas and the dimension of said gap being selected for allowing the formation of electronically excited dimers to take place.

Accordingly, a so-called excimer lamp is used as an illumination source in the photoconductive switch according to the invention, and such an illumination source is known to emit intense radiation of a certain wavelength with very low background, i.e. a very low intensity of light with other wavelengths. The wavelength at which the light is emitted is determined by the choice of gas atoms for said gas or gas mixture, since the "excimers" (excited dimers) created emit a photon of a well-defined energy when they decompose. This means that the power efficiency of the illumination source will be very high, so that it will be easy to quickly and reliably control the switch without any powerful energy source. The fact that said dimers only exist in the excited state, i.e. under normal conditions they do not possess a stable ground state, explains a very important property of these illumination sources, namely that they are completely transparent to the radiation generated by the discharge in the gas creating said free electrons. Reabsorption of their own radiation cannot occur, as there are no stable molecules which could absorb the radiation, allowing unhindered passage of the photons formed through the gas. This is one of the main reasons for the high intensities and high efficiency of these illumination sources.

According to a preferred embodiment of the invention said illumination device comprises at least one blind hole structure with at least a bottom-near part forming a first electrode and an upper part forming a second electrode and means for applying said voltage for creating said free electrons across said electrodes forming a cathode and an anode. Such a blind hole structure is known through for example "Emission of excimer radiation from direct current, high-pressure hollow cathode discharges", Appl. Phys. Lett. 72 (1), Jan. 5, 1998, and it is called "hollow cathode" although it is not necessarily a cathode that is hollow, but the cathode and anode being a part of a hollow structure. It has been found that discharges generating the emission of photons when said unstable electronically excited dimers decompose are stable at much higher currents in such blind hole structures of small hole diameters than when the mechanism of creating unstable electronically excited dimers for a generation of light is utilized by applying a voltage across an anode and a cathode separated by said gas or gas mixture without any blind hole structure. Accordingly, such an illumination device may efficiently create a high power for the illumination of the first layer of the switch making it very fast and closing with a low on-state resistance.

According to another preferred embodiment of the invention the first and second electrode of the blind hole structure are separated by wall parts made of a dielectric material, and the arrangement of such a dielectric material between the two electrodes prevents the hot, high-velocity electrons created through the voltage applied across the electrodes from causing an arc discharge.

According to another preferred embodiment of the invention the switch comprises a means for generating said voltage high enough for creating said free electrons and adapted to generate a voltage of 20 V–2 kV across said electrodes. A voltage within this range will be enough for creating a high intensity light for advantageously controlling a switch of this type.

According to another very preferred embodiment of the invention said device comprises an array of said blind hole structures. By arranging an array of said blind hole structures light of a very high intensity with very little background radiation may be created, especially if the largest cross-section dimension of each blind hole structure, i.e. normally the diameter of the blind hole, is small, such as smaller than 500 $\mu$m and preferably smaller than 200 $\mu$m, which enables the provision of more than $10^4$, especially more than $10^5$, and preferable more than $5\times10^5$ blind hole structures in said array. This means that power in the order of megawatts may be emitted by such an illumination device.

According to another preferred embodiment of the invention constituting a further development of the embodiment last mentioned said illumination device comprises means for focusing light emitted from the respective blind hole structure towards said first layer of the switch, so that the light emitted from each individual blind hole structure may be added to the total light applied on said first layer of the switch, and said focusing means is according to another preferred embodiment of the invention formed by arranging said array of blind hole structures along a circle arc with the axis of the respective blind hole pointing substantially towards the center of said circle and arranging said first layer of the switch in the region of said center.

According to another preferred embodiment of the invention said first layer is made of an intrinsic material, and the switch is adapted to be conducting when the first layer is illuminated and a voltage is applied across the contact electrodes thereof irrespectively of the direction of said voltage and in a blocking state when no irradiation of the first layer takes place, in which it is particularly interesting to use diamond as said material of the first layer, since this means that the switch will be able to hold very high voltages in the blocking state thereof, thanks to the large energy gap between the valence band and the conduction band in diamond (5.4 eV).

According to another preferred embodiment of the invention said volume contains a gas mixture of krypton and chlorine for creating an unstable electronically excited dimer in the form of KrCl emitting UV-light of a wavelength of 222 nm when decomposing, which is very suitable when said first layer is made of diamond, since 222 nm corresponds to 5.6 eV, so that light of a very high intensity closely above the energy corresponding to the energy gap between the valence band and the conduction band of diamond is created and will be efficiently absorbed by said first layer for making it conducting.

According to another preferred embodiment of the invention said material of the first layer is SiC, and said volume contains a gas mixture of xenon and chlorine for creating an unstable electronically excited dimer in the form of XeCl emitting UV-light of a wavelength of 308 nm when decomposing. This wavelength corresponding to an energy of 4.0 eV is suitable for creating free charge carriers in SiC having a band gap between 3.2 eV and 3.8 eV depending on the polytype.

The invention also relates to a use of a device for illumination defined above as an illumination source for controlling a photo-conductive switch, and the advantages of such a use appear clearly from above.

Further advantages as well as advantageous features of the invention will appear from the following description and the other dependent claims.

BRIEF DESCRIPTION OF THE DRAWINGS

With reference to the appended drawings, below follows a specific description of preferred embodiments of the invention cited as examples.

In the drawings:

FIG. 1 a schematic cross-section view of a photoconductive switch according to a first preferred embodiment of the invention, FIG. 2 is a schematic cross-section view of a photoconductive switch according to a second preferred embodiment of the invention.

DETAILED DESCRIPTION OF PREFERRED EMBODIMENTS OF THE INVENTION

Figure 3:
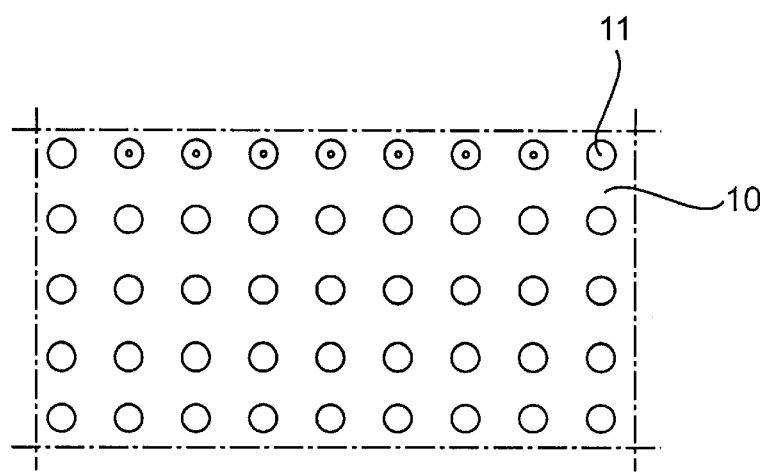
FIG. 3 is a partial view in the direction of the arrow A in FIG. 2.

A switch according to a first preferred embodiment of the invention is very schematically shown in FIG. 1, and this photoconductive switch has a first layer 1, which in this case is made of intrinsic diamond, and two contact layers 2, 3 connectable to different potentials for applying a voltage across the first layer. Accordingly, the two contact layers are adapted to be connected to for example an electric circuit of an apparatus for controlling a power network.

The switch also comprises an irradiation source 4 which has a casing 5 hermetically enclosing a gas or gas mixture having gas atoms able to form unstable electronically excited dimers when such a voltage is applied over a gap in said volume that free electrons are created an accelerated to come into collision with said gas atoms for excitation thereof. Two electrodes 6, 7 of a means for generating said voltage for creation of free electrons in the volume 19 of the casing are arranged outside said casing on opposite sides thereof and adapted to apply a voltage over these electrodes. At least the walls 8 of the casing facing said first layer 1 are made of light transparent material, such as quartz. Quartz is suitable when diamond is used for said first layer and KrCl is formed as electronically excited dimers in said casing, since the nature of quartz makes the energy of the light low enough for not being absorbed by the quartz.

As declared above excimers are unstable molecular complexes which occur only under extreme conditions, such as those temporarily existing in special types of gas discharge. Typical examples are molecular bonds between two rare gas atoms ($Ar_2"$, $Kr_2"$, $Xe_2"$) or between a rare gas atom and a halogen atom ($ArCl"$, $KrCl"$, $XeCl"$, $XeF"$). The asterisk indicates that it is an electronically excited molecular complex (excited dimer=excimer). When the voltage high enough is created between the two electrodes 6, 7 through a high voltage generator 9 connected thereto is high enough the gas in the casing breaks down electrically and a large number of thin current channels or micro discharges are formed under the condition that the product of the particle density, i.e. the pressure, and the gap spacing between the electrodes is large enough. Free electrons e are in this way created, and they are accelerated in the electric field between the two electrodes and hit a gas atom and excite this atom, and when such an excited gas atom and a non-excited gas atom come to a collision with each other and an electron, an electronically excited dimer and an electron are formed, which for the case of xenon (Xe) means:

$$e + Xe + Xe \rightarrow e + Xe" + Xe" \rightarrow Xe_2" + e$$

The probability that this process will occur increases of course with the pressure. The excimer formation takes place within a fraction of a nanosecond, and the excimer decompose within a few nanoseconds to give up its excitation energy in the form of a photon:

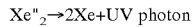
$$Xe"_2 \rightarrow 2Xe + UV\ photon$$

The pressure dependency of this reaction will be discussed further below with reference to FIG. 4.

Practically all light created through this mechanism will be restricted to a certain wavelength with very little background radiation.

A switch according to a second very preferred embodiment of the invention is shown in FIGS. 2 and 3. This switch has an illumination source comprising an array 10, as illustrated in FIG. 3, of blind hole structures 11, so-called hollow cathodes, with the bottom of the blind hole formed by a first electrode 12, an anode, and the upper part of the wall formed by a second electrode 13, a cathode, penetrated by said blind hole. The two electrodes are separated by wall parts 14 of a dielectric material. Typical dimensions of this blind hole structure are a diameter of the hole of approximately 100 $\mu$m and a thickness of the dielectric wall parts 14, i.e. a distance between the cathode and the anode, of approximately 200 $\mu$m. A voltage generator 9' is arranged to apply a voltage, preferably a direct voltage in the range of 200 V–2 kV between the electrodes. A single such blind hole structure 11 may cause a discharge current as high as 7 mA when applying a voltage of a few hundred volts between the electrodes.

Said array of blind hole structures 11 are arranged along a circle arc 15 with the axis of the respective blind hole pointing substantially towards the center of said circle for focusing the light emitted from the respective blind hole structure towards said center and by that said first layer, which is arranged in the region of said center. The array has preferably a high number of such blind hole structures for together emitting light in the megawatt range.

Figure 4:
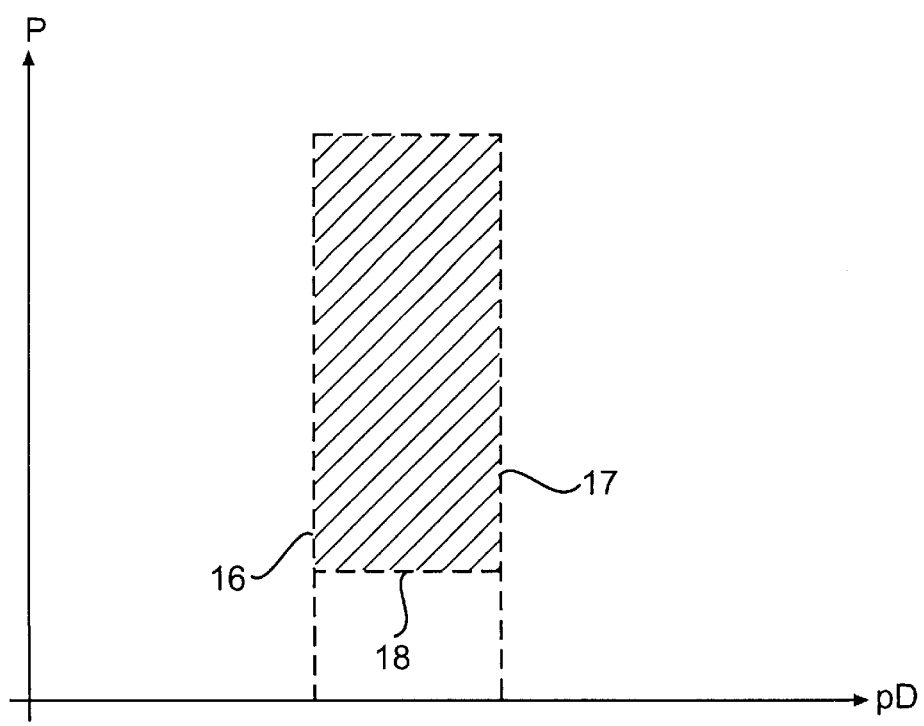
FIG. 4 is a diagram illustrating the dependency of the excimer mechanism used for the generation of light in the photoconductive switches according to the invention upon the pressure of the gas or gas mixture in said volume and the diameter of a blind hole structure illustrated in FIGS. 2 and 3.

The mechanism described above of the generation of unstable electronically excited dimers through the application of a voltage across the electrodes 12, 13 only occurs in such "hollow cathodes" under certain conditions, namely when pD is within a given range, as illustrated in FIG. 4 through the two dashed lines 16, 17, p being the gas pressure in the blind hole and D the diameter thereof. Furthermore, since the formation of the excimers is a three-part collision process it is important that the pressure is not too low for obtaining a high probability of the occurrence of such a collision, so that the pressure has to be above a certain level 18 before the excimer process really starts. The higher the pressure is the higher is the probability of such collisions, but there is also an upper limit for the pressure. Accordingly, it is advantageous to be well above the level 18 shown in FIG. 4, which means a small diameter of said blind hole resulting in a possibility to arrange such blind holes at a high density. It is suitable to have a gas pressure in the volumes in the illumination devices of FIGS. 1 and 2 of 0.1–10 bars. Although not shown in FIG. 2 the volume 19 inside the circle arc is of course hermetically closed for keeping the gas inside thereof.

An excimer lamp of the type defined above in particular shown in FIG. 2, could operate in pulse or continuous mode, which makes it possible for the switch to work both in closed or opened mode.

The invention is of course not in any way restricted to the preferred embodiments described above, but many possibilities to modifications thereof would be apparent to a man with ordinary skill in the art without departing from the basic idea of the invention.

The material of the first layer is preferably a wide band gap material, i.e. a material having a band gap exceeding 2.5 eV, such as for instance SiC. When using SiC, XeCl-gas will be appropriate, since an excimer formed by these two atoms will decompose while emitting light of an energy of 4 eV suitable for lifting electrons from the valence band to the conduction band of SiC.

The first electrode may in the case of a blind hole structure form only a part of the bottom of the blind hole or the entire bottom and the bottom-near part of the walls thereof, or the electrodes may be modified in any other way as long as they are spaced apart.

The volume may also contain a gas mixture of at least three components, such as Kr, Cl and F, for creating unstable electronically excited dimers of at least two different types (here KrCl and KrF) emitting light of at least two different wave lengths when decomposing for obtaining more than one line.

What is claimed is:

1. A photoconductive switch comprising at least a first layer (1) and two contact layers (2, 3) arranged on said first layer and connectable to different potentials for applying a voltage thereacross, said first layer being adapted to be conducting upon applying a voltage across said contact layers when exposed to light from an illumination source (4) of an energy high enough for exciting charge carriers in the material of said first layer, characterized in that the illumination source is a device comprising a volume (19) filled with a gas or gas mixture having gas atoms able to form unstable electronically excited dimers when such a voltage is applied over a gap in said volume that free electrons are created and accelerated to come into collision with said gas atoms for excitation thereof, said dimers decomposing into two gas atoms while emitting a photon of an energy suitable for exciting charge carriers in said material of the first layer, the pressure of the gas and the dimension of said gap being selected for allowing the formation of electronically excited dimers to take place.

2. A switch according to claim 1, characterized in that said illumination device comprises at least one blind hole structure (11) with at least a bottom-near part forming a first electrode (12) and an upper part forming a second electrode (13) and means (9, 9') for applying said voltage for creating said free electrons between said electrodes forming a cathode and an anode.

3. A switch according to claim 2, characterized in that the first and second electrode of the blind hole structure (11) are separated by wall parts (14) made of a dielectric material.

4. A switch according to claim 3, characterized in that the electrodes (12, 13) are separated through said wall parts (14) by a distance exceeding the largest cross-section dimension of the blind hole structure.

5. A switch according to claim 2, characterized in that said first electrode (12) forms at least the bottom of the blind hole structure (11).

6. A switch according to claim 2, characterized in that the first electrode (12) forms an anode and the second electrode (13) a cathode.

7. A switch according to claim 2, characterized in that it comprises means (9') for generating said voltage high enough for creating said free electrons and adapted to generate a voltage of 20 V–2 kV between said electrodes.

8. A switch according to claim 7, characterized in that said voltage is a direct voltage.

9. A switch according to claim 2, characterized in that the largest cross-section dimension of said blind hole structure (11) is smaller than 500 $\mu$m.

10. A switch according to claim 2, characterized in that said device comprises an array (10) of said blind hole structures (11).

11. A switch according to claim 10, characterized in that said array is formed by more than $10^4$ blind hole structures.

12. A switch according to claim 11, characterized in that said illumination device comprises means for focusing light emitted from the respective blind hole structure towards said first layer (1) of the switch.

13. A switch according to claim 12, characterized in that said focusing means is formed by arranging said array (10) of blind hole structures (11) along a hemispherical or parabolic arc (15) with the axis of the respective blind hole pointing substantially towards the centre of said arc, and that said first layer of the switch is arranged in the region of said centre.

14. A switch according to claim 10, wherein said array is formed by more than $10^5$ blind hole structures.

15. A switch according to claim 10, wherein said array is formed by more than $5 \times 10^5$ blind hole structures.

16. A switch according to claim 2, wherein the largest cross-sectional dimension of said blind hole structure (11) is smaller than 200 $\mu$m.

17. A switch according to claim 1, characterized in that the gas pressure in said volume is 0.1–10 bars.

18. A switch according to claim 1, characterized in that said first layer (1) is made of an intrinsic material, and that the switch is adapted to be conducting when the first layer is illuminated and a voltage is applied across the contact layers thereof irrespectively of the direction of said voltage and in a blocking state when no illumination of the layer takes place.

19. A switch according to claim 1, characterized in that the material of the first layer (1) is a wide band gap material, i.e. a material having an energy gap between the valence band and the conduction band thereof exceeding 2.5 eV.

20. A switch according to claim 19, characterized in that said material is diamond.

21. A switch according to claim 20, characterized in that said volume (19) contains a gas mixture of krypton and chlorine for creating an unstable electronically excited dimer in the form of KrCl emitting UV-light of a wave length of 222 nm when decomposing.

22. A switch according to claim 1, characterized in that said volume (19) contains a gas mixture of xenon and fluorine for creating an unstable electronically excited dimer in the form of XeF, which emits photons of a wavelength of 351 nm when decomposing.

23. A switch according to claim 1, characterized in that said material of the first layer (1) is SiC, and that said volume contains a gas mixture of xenon and chlorine for creating an unstable electronically excited dimer in the form of XeCl emitting UV-light of a wavelength of 308 nm when decomposing.

24. A switch according to claim 1, characterized in that said volume (19) contains a gas mixture of at least three components for creating unstable electronically excited dimers of at least two different types emitting light of at least two different wave lengths when decomposing.

25. A switch according to claim 1, characterized in that it comprises means adapted to generate said voltage over said gap continuously over a longer period of time or interrupting said generation for a longer period of time for having the switch either continuously open or continuously closed.

26. A switch according to claim 1, characterized in that it comprises means adapted to generate said voltage over said gap in a pulsed manner to control the switch to change state, open or closed, for a short period of time.

27. A use of a switch according to claim 1 for switching high powers and/or high voltages and/or high currents.

28. A use according to claim 27 in a device for protection of equipment for electric power applications.

29. A switch according to claim 1, characterized in that said illumination device comprises a casing (5) hermetically enclosing said gas or gas mixture, that two electrodes (6, 7) of a means for generating said voltage for the creation of free electrons in the volume are arranged outside said casing on opposite sides thereof and the means is adapted to apply a voltage to these electrodes, that the first layer (1) of the switch is arranged outside said casing, and that at least the walls of the casing facing said first layer are made of optically transparent material.

30. A switch according to claim 29, characterized in that said means (9) is arranged to apply an alternating voltage to said electrodes.

31. A switch according to claim 29, characterized in that said light transparent walls (8) are made of quartz.

32. A use of a device comprising a volume filled with a gas or gas mixture having gas atoms able to form unstable electronically excited dimers when such a voltage is applied over a gap in said volume that free electrons are created and accelerated to come into collision with said gas atoms for excitation thereof, said dimers decomposing into two gas atoms while emitting a photon of an energy suitable for lifting charge carriers from the valence band to the conduction band of a material of a first layer of a photoconductive switch generating a conductive path between two contact layers arranged on said first layer that are connected to different potentials for applying a voltage thereacross, the pressure of the gas and the dimension of said gap being selected for allowing the formation of electronically excited dimers to take place, as an illumination source for controlling a photoconductive switch.

* * * * *